(12) United States Patent
Yoo et al.

(10) Patent No.: US 7,875,983 B2
(45) Date of Patent: Jan. 25, 2011

(54) SEMICONDUCTOR PACKAGE

(75) Inventors: Do-Jae Yoo, Seoul (KR); Young-Do Kweon, Seoul (KR); Seog-Moon Choi, Seoul (KR); Bum-Sik Jang, Seongnam-si (KR); Tae-Sung Jeong, Hwaseong-si (KR)

(73) Assignee: Samsung Electro-Mechanics Co., Ltd., Suwon (KR)

( * ) Notice: Subject to any disclaimer, the term of this patent is extended or adjusted under 35 U.S.C. 154(b) by 0 days.

(21) Appl. No.: 12/591,792

(22) Filed: Dec. 1, 2009

(65) Prior Publication Data

US 2010/0084754 A1    Apr. 8, 2010

Related U.S. Application Data

(62) Division of application No. 12/068,867, filed on Feb. 12, 2008, now Pat. No. 7,642,656.

(30) Foreign Application Priority Data

Jun. 12, 2007    (KR)    ............. 10-2007-0057147

(51) Int. Cl.
*H01L 23/48*    (2006.01)
*H01L 23/52*    (2006.01)
*H01L 29/40*    (2006.01)

(52) U.S. Cl. ................................. 257/777; 257/778

(58) Field of Classification Search ............. 257/777, 257/778
See application file for complete search history.

(56) References Cited

U.S. PATENT DOCUMENTS 7,242,081 B1    7/2007    Lee 7,288,841 B2    10/2007    Yamano
2006/0255449 A1 *    11/2006    Lee et al. ................. 257/698
2007/0235850 A1    10/2007    Gerber et al.

OTHER PUBLICATIONS

U.S. Appl. No. 12/068,867, filed Feb. 12, 2008, Do-Jae Yoo et al.
U.S. Patent Office Action, mailed Jan. 16, 2009, issued in corresponding U.S. Appl. No. 12/068,867.
U.S. Patent Office Action, mailed Apr. 23, 2009, issued in corresponding U.S. Appl. No. 12/068,867.
U.S. Patent Notice of Allowance, mailed Aug. 26, 2009, issued in corresponding U.S. Appl. No. 12/068,867.
U.S. Patent Notice of Allowance mailed Sept. 13, 2010 in corresponding U.S. Appl. No. 12/591,793.
U.S. Patent Office Action mailed Nov. 19, 2010 in corresponding U.S. Appl. No. 12/591,791.

* cited by examiner

*Primary Examiner*—Thien F Tran

(57) ABSTRACT

A semiconductor package which includes a first substrate having a pre-designed pattern formed thereon; a first chip mounted by a flip chip method on one side of the first substrate; a support formed to a predetermined thickness on an edge of the first substrate; an interposer having an edge thereof placed on the support, such that the interposer covers the first substrate and forms a cavity between the interposer and the first substrate, and having a pre-designed pattern formed respectively on both sides thereof; a via penetrating the support and the interposer; a second chip mounted on one side of the interposer facing the first substrate; a second substrate placed on the other side of the interposer with at least one conductive ball positioned in-between; and a third chip mounted on the second substrate.

5 Claims, 24 Drawing Sheets

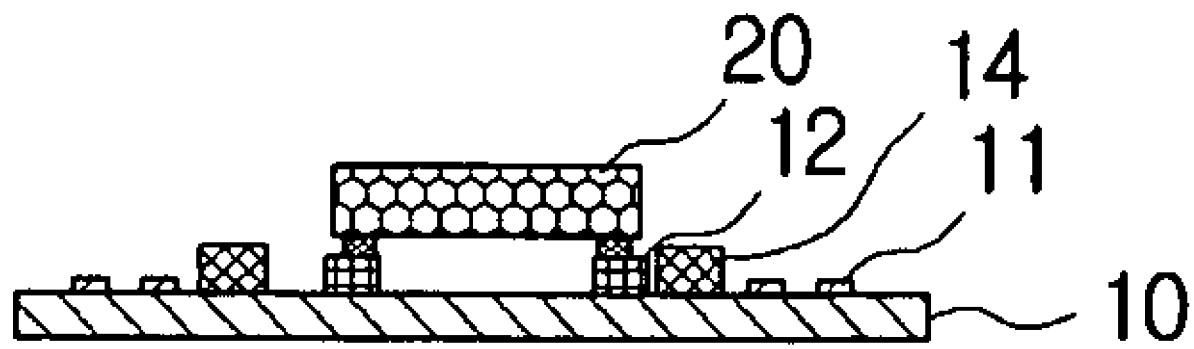

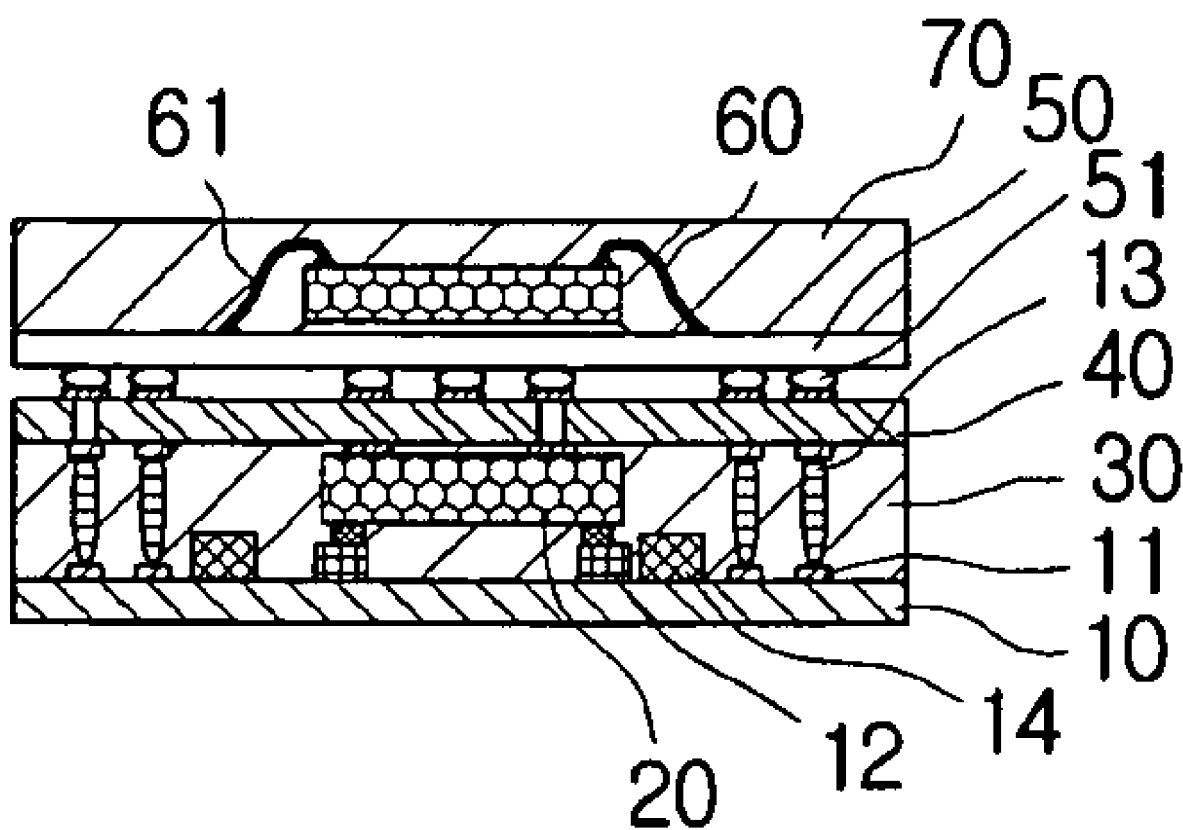

SEMICONDUCTOR PACKAGE

CROSS-REFERENCE TO RELATED APPLICATIONS

This application is a U.S. divisional application filed under 35 USC 1.53(b) claiming priority benefit of U.S. Ser. No. 12/068,867 filed in the United States on Feb. 12, 2008, now U.S. Pat. No. 7,642,656 which claims earlier priority benefit to Korean Patent Application No. 10-2007-0057147 filed with the Korean Intellectual Property Office on Jun. 12, 2007, the disclosures of which are incorporated herein by reference.

BACKGROUND

1. Field

The present invention relates to a semiconductor package.

2. Description of the Related Art

The trend in current electronic devices, such as MP3 players, cell phones, and laptops, etc., is towards designs that include numerous semiconductor chips packaged on the main board, such that multiple functions may be performed within an extremely small area, as well as structures that allow miniaturized sizes and facilitated heat release. Accordingly, the semiconductor chips are being given higher degrees of integration, and the sizes of the semiconductor packages are being reduced.

Furthermore, as semiconductor packages are expected to not only provide low thickness, light weight, and small size, but also higher performance and greater systemization, there has also been developed a method of stacking several packages together, so that packages having various functions can be implemented as a single package.

FIG. 1 is a cross-sectional view of a semiconductor package according to the related art, which presents a package-on-package (POP) structure, where a package is stacked again over another package. In order to stack a package over another package having an embedded chip according to the related art, the structure may include metal pads formed around the chip mounted on the lower portion, between the upper layer and lower layer packages, such that the metal pads may connect the upper layer package with the lower layer package.

However, in the semiconductor package according to the related art, the metal pads for mounting the upper layer package may reduce the mounting area, making it difficult to obtain a sufficient space for mounting passive components such as RLC. Also, in stacking the package, warpage that can occur in the packages may pose difficulties in achieving secure stacking.

SUMMARY

An aspect of the invention is to provide a semiconductor package, and a method for the manufacturing of the semiconductor package, in which heat-releasing performance can be improved, and a higher degree of integration can be implemented.

One aspect of the invention provides a semiconductor package that includes: a first substrate, on which a pre-designed pattern is formed; a first chip, which is mounted by a flip chip method on one side of the first substrate; a first molding, which covers the first substrate and the first chip; a first via, which penetrates the first molding, and which is electrically connected with the pattern formed on the first substrate; an interposer, which is placed on the first molding, and on both sides of which a pre-designed pattern is formed respectively; a second via, which penetrates the interposer and electrically connects both sides of the interposer; a second substrate, which is placed on the interposer with at least one conductive ball positioned in-between, such that the second substrate is electrically connected with the pattern formed on the interposer; and a second chip mounted on the second substrate.

The interposer can be a metal oxide layer, and may be made, for example, of aluminum oxide ($Al_2O_3$). One or more passive components can be mounted on the first substrate. The first via may be a solder bump.

The second chip may be connected to the second substrate by a wire bonding method, and a second molding may additionally be included that covers the second chip and the second substrate. Multiple conductive balls can be formed on the other side of the first substrate.

Another aspect of the invention provides a method of manufacturing a semiconductor package that includes: mounting a first chip by a flip chip method on a first substrate, on which a pre-designed pattern is formed; forming at least one bump by performing soldering, on at least one predetermined position electrically connected with the pattern formed on the first substrate; forming a first molding by performing molding, such that the first molding covers the first substrate and the first chip; placing an interposer on the first molding; and placing a second substrate, on which a second chip is mounted, on the interposer.

After forming the first molding, an operation may further be included, of grinding a portion of the first molding. The interposer can be a metal oxide layer, and may be made, for example, of aluminum oxide ($Al_2O_3$).

In certain embodiments, the method may further include mounting at least one passive component on one side of the first substrate, and/or may include coupling conductive balls onto the other side of the first substrate.

Still another aspect of the invention provides a semiconductor package that includes: a first substrate, on which a pre-designed pattern is formed; a first chip, which is mounted by a flip chip method on one side of the first substrate; a support, which is formed to a predetermined thickness on an edge of the first substrate; an interposer, which has an edge thereof placed on the support such that the interposer covers the first substrate and forms a cavity between the interposer and the first substrate, and which has a pre-designed pattern formed respectively on both sides; a via, which penetrates the support and the interposer; a second chip, which is mounted on one side of the interposer facing the first substrate; a second substrate, which is placed on the other side of the interposer with at least one conductive ball positioned in-between; and a third chip, mounted on the second substrate.

The interposer can be a metal oxide layer, and may be made, for example, of aluminum oxide ($Al_2O_3$). One or more passive components can be mounted on the first substrate. The first via may be a solder bump.

One or more passive components can be mounted on the first substrate, and conductive balls can be formed on the other side of the first substrate.

Yet another aspect of the invention provides a method of manufacturing a semiconductor package that includes: mounting a first chip by a flip chip method on a first substrate, on which a pre-designed pattern is formed; forming a cavity by etching a center portion of a metal oxide layer; mounting a second chip inside the cavity; forming at least one via such that the via penetrates an edge of the metal oxide layer; placing the metal oxide layer on the first substrate such that the second chip and the first chip face each other; and placing a second substrate on the metal oxide layer, with a third chip mounted on the second substrate.

Aluminum oxide ($Al_2O_3$) can be used for the metal oxide layer. In some embodiments, the method may further include mounting at least one passive component on the first substrate.

Also, the method may further include coupling multiple conductive balls onto the other side of the first substrate.

Additional aspects and advantages of the present invention will be set forth in part in the description which follows, and in part will be obvious from the description, or may be learned by practice of the invention.

BRIEF DESCRIPTION OF THE DRAWINGS

FIG. 4A, FIG. 4B, FIG. 4C, FIG. 4D, FIG. 4E, FIG. 4F, FIG. 4G, FIG. 4H, and FIG. 4I are cross-sectional views representing a flow diagram for the method of manufacturing a semiconductor package of FIG. 3.

FIG. 7A, FIG. 7B, FIG. 7C, FIG. 7D, FIG. 7E, FIG. 7F, FIG. 7G, FIG. 7H, FIG. 7I, and FIG. 7J are cross-sectional views representing a flow diagram for the method of manufacturing a semiconductor package of FIG. 6.

DETAILED DESCRIPTION OF EMBODIMENTS

Figure 1:
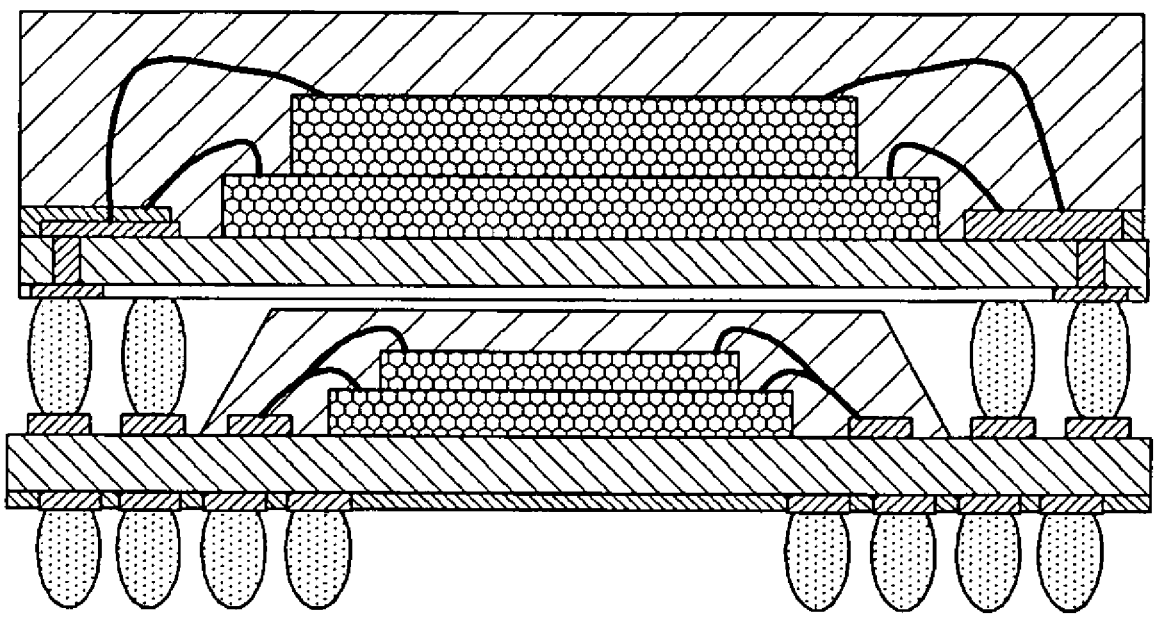
FIG. 1 is a cross-sectional view of a semiconductor package according to the related art.

The semiconductor package and method for the manufacturing of the semiconductor package according to certain embodiments of the invention will be described below in more detail with reference to the accompanying drawings. Those elements that are the same or are in correspondence are rendered the same reference numeral regardless of the figure number, and redundant explanations are omitted.

Figure 2:
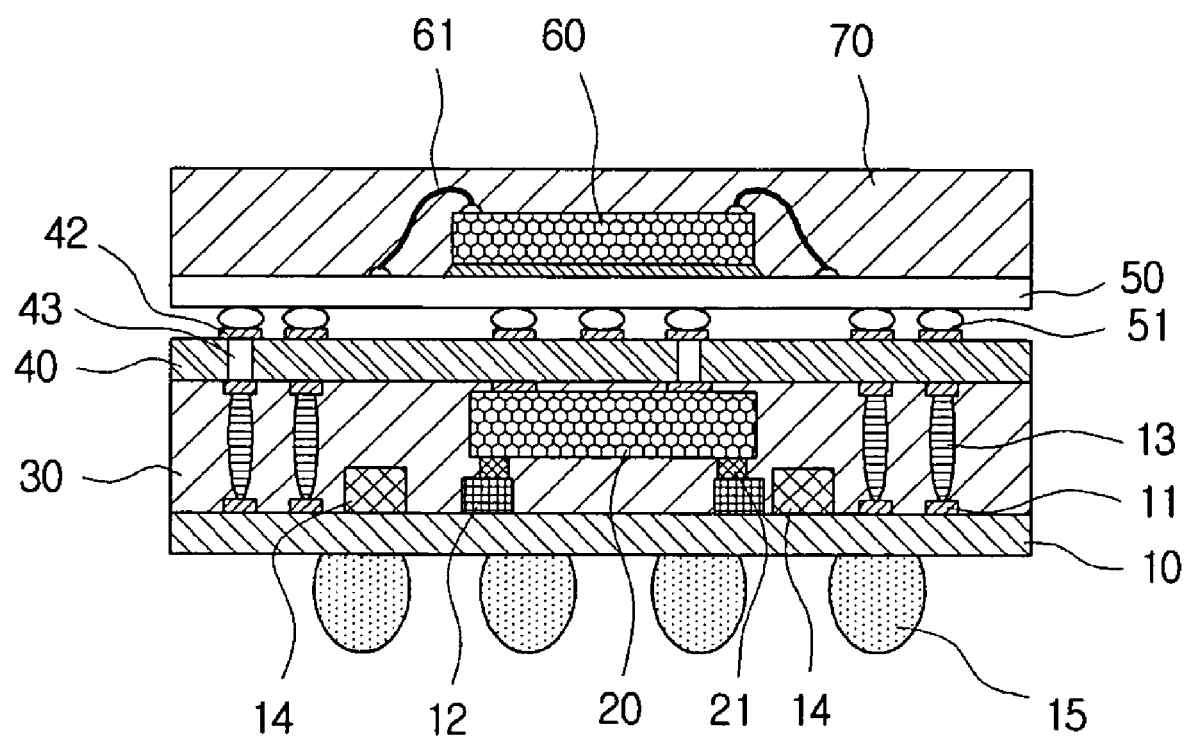
FIG. 2 is a cross-sectional view of a semiconductor package according to an aspect of the invention.

FIG. 2 is a cross-sectional view of a semiconductor package according to an aspect of the invention. In FIG. 2 are illustrated substrates 10, 50, patterns 11, 42, pads 12, bumps 13, passive components 14, conductive balls 15, 51, chips 20, 60, solder 21, moldings 30, 70, an interposer 40, vias 43, and wires 61.

The semiconductor package according to this embodiment may be structured to have an upper layer package stacked over a lower layer package with an interposer 40 in-between. The structure of the lower layer package will first be described as follows.

The substrate 10 forms the base of the lower layer package, where a pre-designed pattern 11 and pads 12, as well as passive components 14, may be mounted on the substrate 10. Also, multiple conductive balls 15 can be coupled to the bottom of the substrate 10 to form a BGA (ball grid array).

A chip 20 may be mounted on the substrate 10. The chip 20 may be directly connected, by way of solder 21, to the pads 12 formed on the substrate 10. That is, the chip 20 may be mounted by a flip chip method. As such, not only can a sufficient amount of space be obtained on the substrate 10 for forming the pattern 11, etc., that allows connection with the upper layer package, but also numerous passive components 14, such as RLC, can be mounted, making it possible to systemize the lower layer package by itself.

The substrate 10 may be covered by a molding 30. In other words, the molding 30 may cover the substrate 10 of the lower layer package, as well as the chip 20 and the various components mounted on the substrate 10, so that they may be protected from the exterior.

Here, vias may be formed, which penetrate the molding 30 and serve to electrically connect the lower layer package with an upper layer package, which will be described later.

In this particular embodiment, solder bumps 13 are suggested for the vias. That is, by forming solder bumps 13 to a particular height on the substrate 10 of the lower layer package, and afterwards forming the molding 30, the vias may be formed with greater ease.

Of course, it is apparent that other methods may be used to form the vias, such as by forming the molding 30, perforating holes in the molding 30, and then filling the holes with a conductive material.

An interposer 40 may be placed between the lower layer package composed as described above and the upper layer package described later. In this particular embodiment, a metal oxide layer is suggested for the interposer 40. Using a metal oxide layer may provide a benefit of efficiently dispersing heat that may be generated in the semiconductor package according to this embodiment Also, problems of reliability in stacking, which may be caused by warpage in the lower layer package, may be alleviated. This particular embodiment suggests the use of aluminum oxide ($Al_2O_3$) for the metal oxide layer, in consideration of cost effectiveness and heat-releasing efficiency, etc.

A pre-designed pattern 42 may be formed on each side of the interposer 40. The pattern on the lower side may be electrically connected with the lower layer package, while the pattern on the upper side may be electrically connected with the upper layer package. Also, vias 43 that penetrate the interposer 40 may electrically interconnect the upper and lower sides of the interposer 40. By way of this structure, the lower layer package and the upper layer package may be electrically with each other.

The upper layer package may be stacked on an upper side of this interposer 40. For electrical connection between the upper layer package and the interposer 40, conductive balls 51 may be formed on the bottom of the upper layer package. The structure of the upper layer package will be described in greater detail as follows.

The substrate 50 forms the base of the upper layer package, where a pre-designed pattern (not shown) and a chip 60 may be mounted on the substrate 50. Also, a plurality of conductive balls 51 may be coupled to the bottom of the substrate 50, as described above, to form an electrical connection with the interposer 40.

The chip 60 may be secured to the substrate 50 using an adhesive layer 62, and may be electrically connected by wires 61 to the pattern (not shown) formed on the substrate 50.

The substrate 50 having the chip 60 mounted as such can be covered by a molding 70 and thus can be protected from the exterior.

As with the case of the lower layer package, it is apparent that other elements besides the chip 60, including passive components such as RLC, etc., can be mounted on the substrate 50 of the upper layer package.

Figure 3:
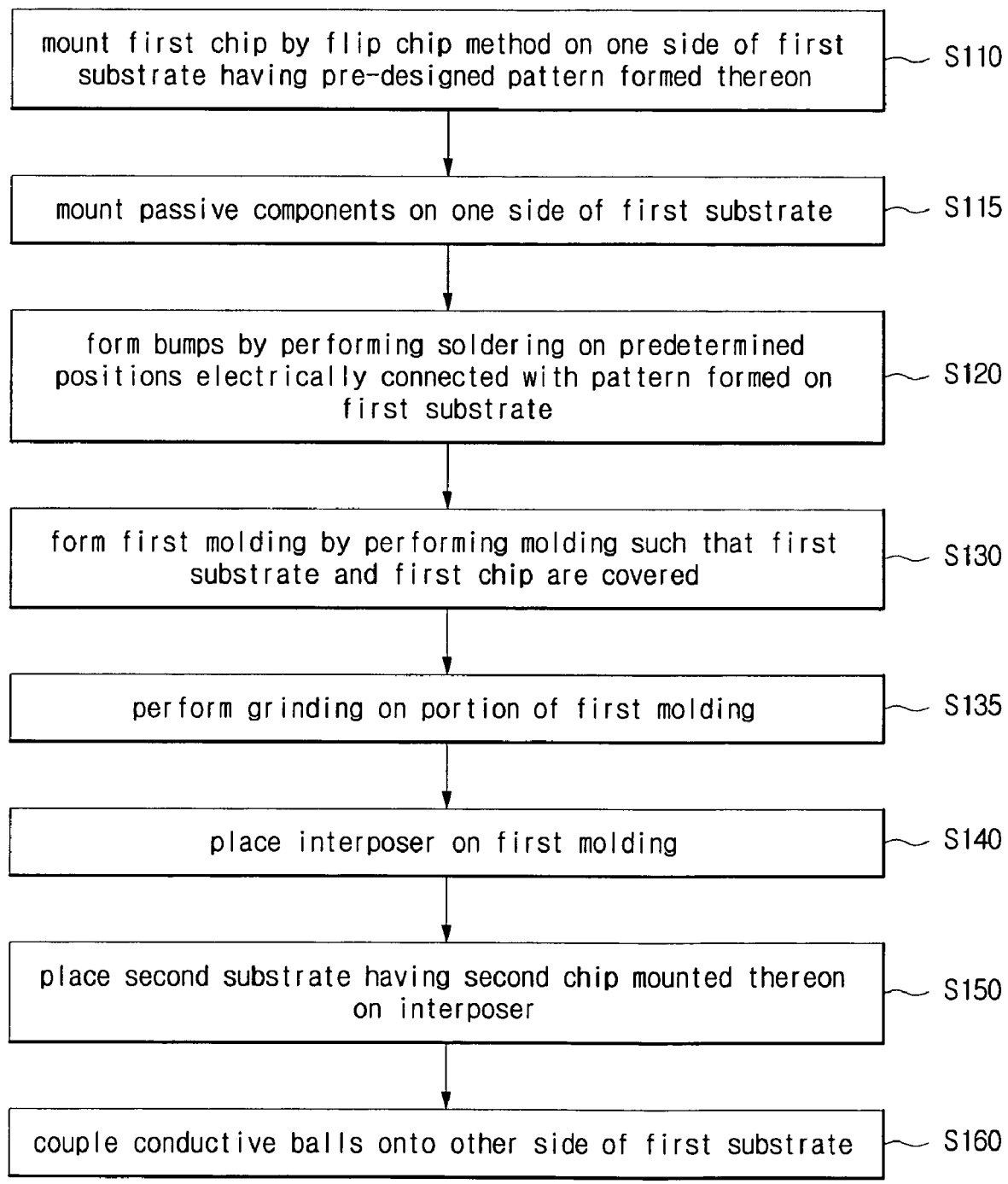
FIG. 3 is a flowchart illustrating a method of manufacturing the semiconductor package of FIG. 2.

A method for the manufacturing of the semiconductor package structured as described above is illustrated in FIG. 3 and FIGS. 4A to 4I. FIG. 3 is a flowchart illustrating a method of manufacturing the semiconductor package of FIG. 2, and FIGS. 4A to 4I are cross-sectional views representing a flow diagram for the method of manufacturing a semiconductor package of FIG. 3. In FIGS. 4A to 4I are illustrated substrates 10, 50, patterns 11, 42, pads 12, bumps 13, passive components 14, conductive balls 15, 51, chips 20, 60, solder 21, moldings 30, 70, an interposer 40, vias 43, and wires 61.

In describing this embodiment, the first substrate, first chip, and first molding refer to the substrate, chip, and molding of the lower layer package, while the second substrate, second chip, and second molding refer to the substrate, chip, and molding of the upper layer package. This distinction, however, is merely for convenience.

Figure 4A:
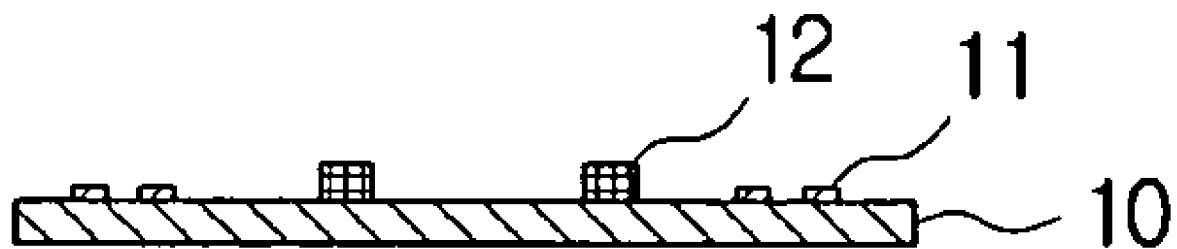
Figure 4B:
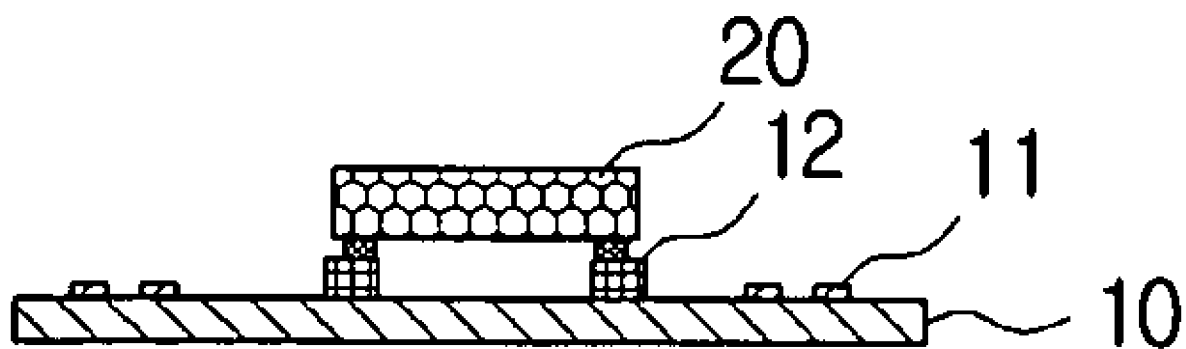

Firstly, the first chip may be mounted by a flip chip method on one side of the first substrate, on which a pre-designed pattern is formed (S110). As illustrated in FIGS. 4A and 4B, the chip 20 may be directly connected to the pads 12 formed on the substrate 10, by way of the solder 21. In this way, not only can a sufficient amount of space be obtained on the substrate 10 for forming the pattern 11, etc., that allows connection with the upper layer package, but also many passive components 14, such as RLC, can be mounted, making it possible to systemize the lower layer package by itself.

Next, as illustrated in FIG. 4C, the passive components may be mounted on one side of the first substrate (S115). As described above, such passive components 14 make it possible to systemize the lower layer package by itself.

Figure 4D:
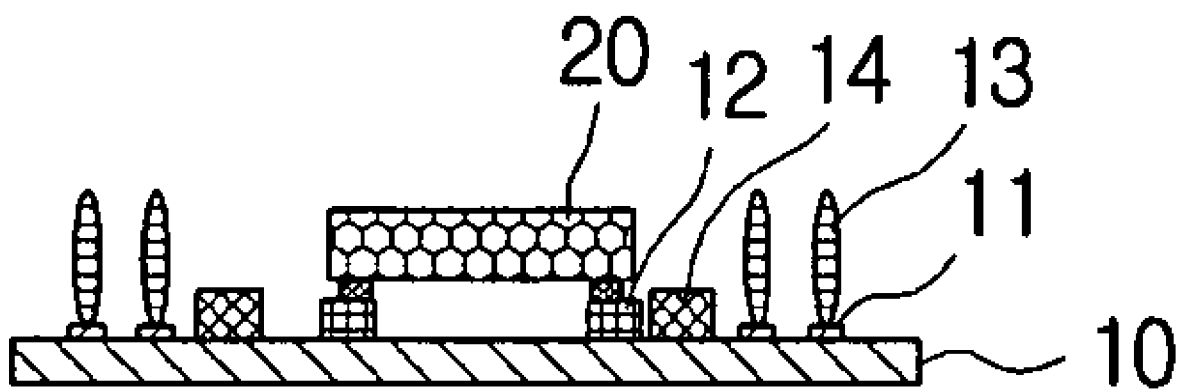

Next, as illustrated in FIG. 4D, bumps may be formed by performing soldering on predetermined positions that are electrically connected with the pattern formed on the first substrate (S120). The bumps 13 thus formed can be used as vias that electrically connect the upper layer package with the lower layer package. Therefore, the bumps 13 can be formed to a height that is sufficient for connecting the lower layer package with the upper layer package.

Figure 4E:
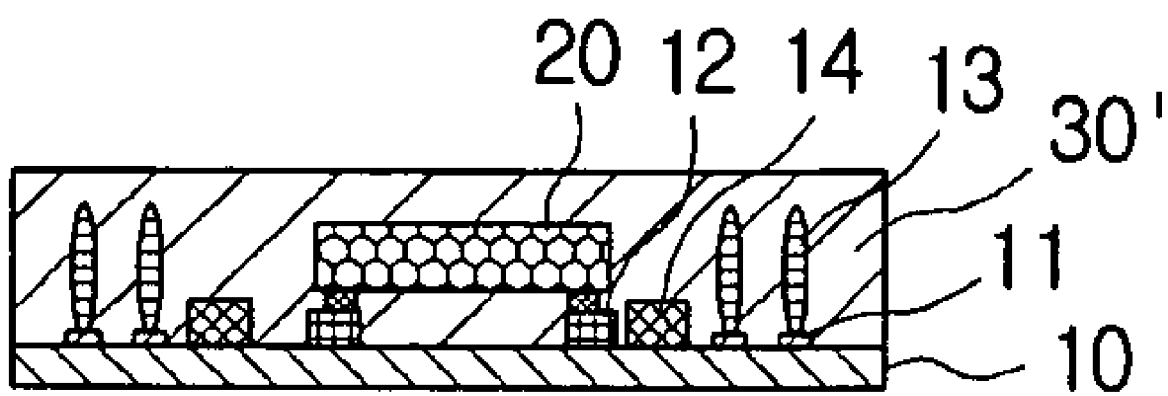

Next, as illustrated in FIG. 4E, the first molding may be formed such that covers the first substrate and the first chip, by performing molding (S130). By having the molding cover the substrate 10 of the lower layer package and the chip 20 and the various components mounted on the substrate 10, the substrate 10, the chip 20, and the components may be protected from the exterior.

Figure 4F:
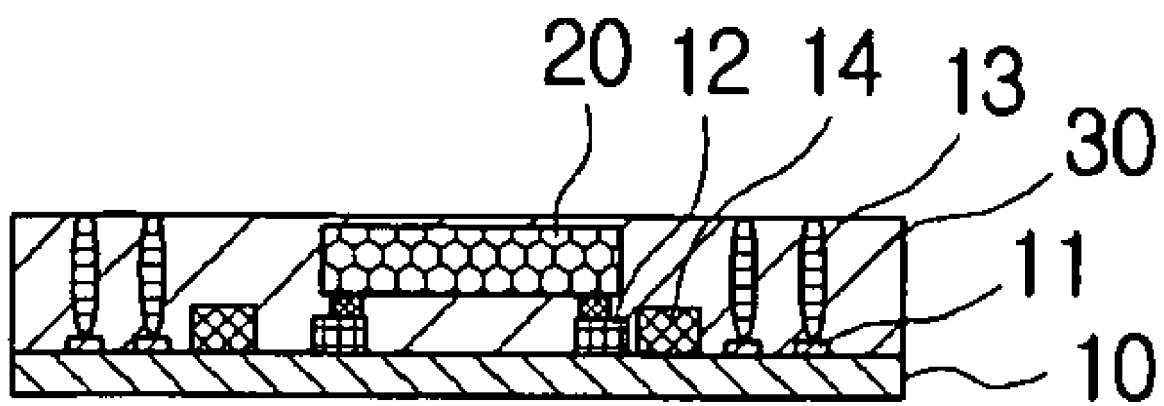

After performing the molding, grinding may be performed on a portion of the first molding (S135), as illustrated in FIG. 4F. This may be to remove a portion of the molding 30' such that the bumps 13 are exposed, in cases where the bumps are completely buried in the molding. By exposing the bumps 13 in this manner, the bumps 13 can be made to function as vias that electrically connect the lower layer package with the upper layer package. Reference numeral 30 illustrated in FIG. 4F represents the molding after grinding has been performed.

Figure 4G:
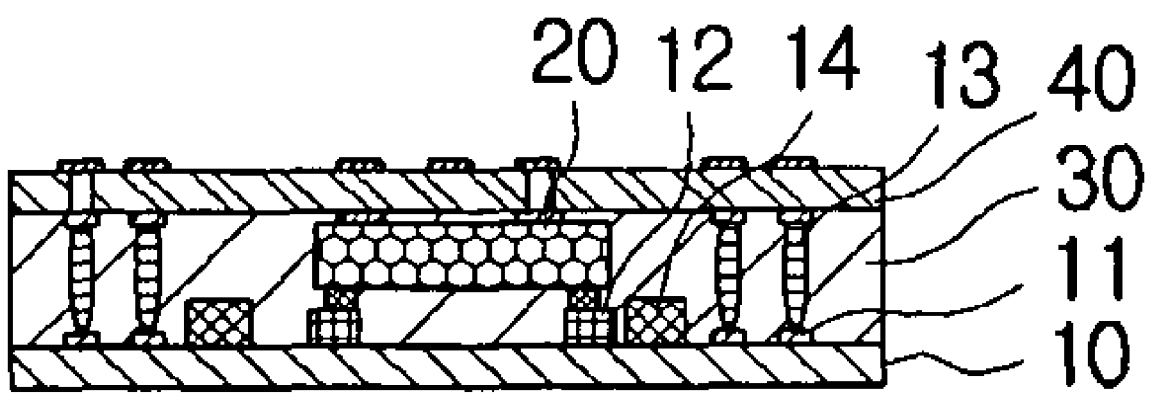
Figure 41:
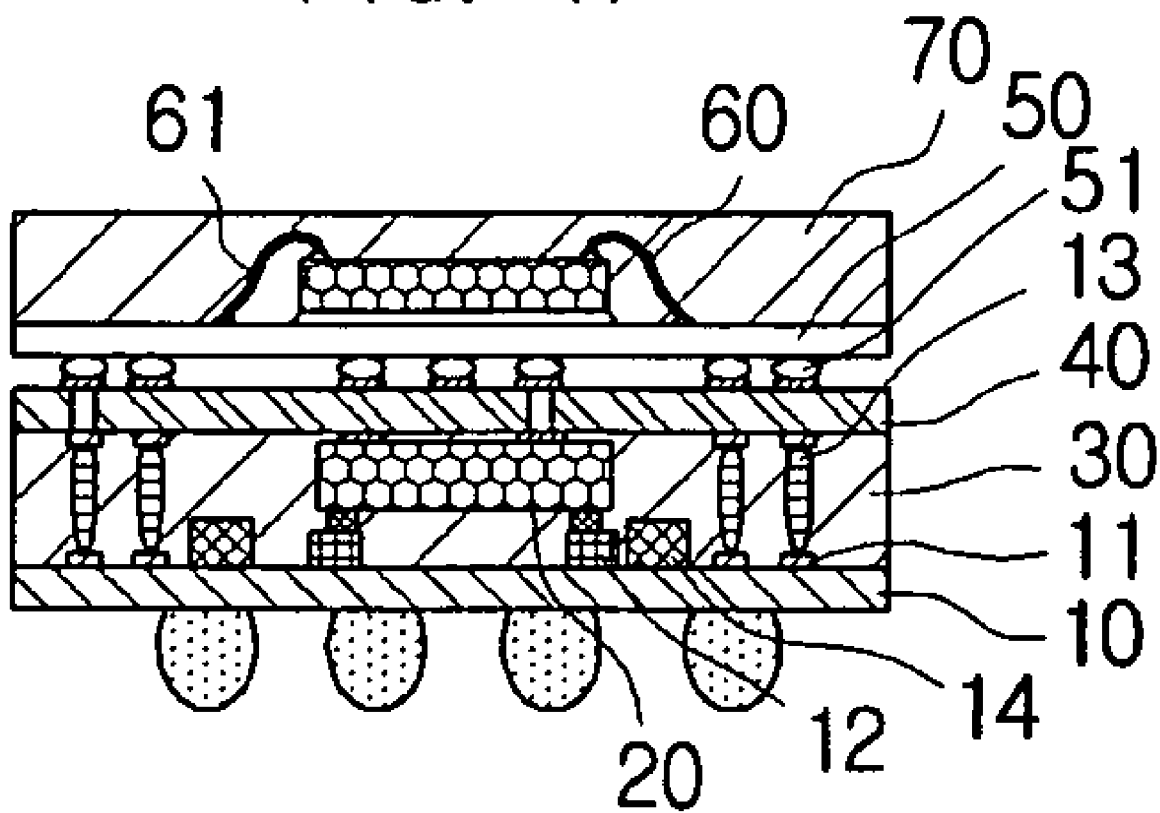

Next, as illustrated in FIG. 4G, the interposer may be placed on the first molding (S140). In this particular embodiment, a metal oxide layer is suggested for the interposer 40. Using a metal oxide layer may provide a benefit of efficiently dispersing heat that may be generated in the semiconductor package according to this embodiment Also, problems of reliability in stacking, which may be caused by warpage in the lower layer package, may be alleviated. This particular embodiment suggests the use of aluminum oxide ($Al_2O_3$) for the metal oxide layer, in consideration of cost effectiveness and heat-releasing efficiency, etc.

Methods of oxidizing aluminum include thermal oxidation methods, in which the aluminum is heated to a temperature near the melting point in an oxygen atmosphere, oxygen plasma treatment, which uses microwaves, methods using ion scattering, and methods using anodized oxidation, etc. Furthermore, deposition methods may also be used, such as CVD (chemical vapor deposition), PECVD (plasma-enhanced chemical vapor deposition), MOCVD (metal organic chemical vapor deposition), ALD (atomic layer deposition), etc.

A pre-designed pattern 42 may be formed on each side of the interposer 40. The pattern on the lower side may be electrically connected with the lower layer package, while the pattern on the upper side may be electrically connected with the upper layer package. Also, vias 43 that penetrate the interposer 40 may electrically interconnect the upper and lower sides of the interposer 40. By way of this structure, the lower layer package and the upper layer package may be electrically with each other.

Next, as illustrated in FIG. 4H, the second substrate, on which a second chip may be mounted, may be placed on the interposer (S150). The second substrate 50 having the second chip 60 mounted can serve as the upper layer package.

The substrate 50 may form the base of the upper layer package, where a pre-designed pattern (not shown) and a chip 60 may be mounted on the substrate 50. Also, a plurality of conductive balls 51 may be coupled to the bottom of the substrate 50, as described above, to form an electrical connection with the interposer 40.

The chip 60 may be secured to the substrate 50 using an adhesive layer 62, and may be electrically connected by wires 61 to the pattern (not shown) formed on the substrate.

The substrate 50 having the chip 60 mounted as such can be covered by the molding 70 and thus can be protected from the exterior.

As with the case of the lower layer package, it is apparent that not only the chip 60, but also other elements, including passive components such as RLC, etc., can be mounted on the substrate 50 of the upper layer package.

Next, as illustrated in FIG. 4I, conductive balls may be coupled to the other side of the first substrate (S160). By coupling a plurality of conductive balls 15 onto the bottom of the substrate 10 of the lower layer package, a BGA (ball grid array) may be obtained.

Figure 5:
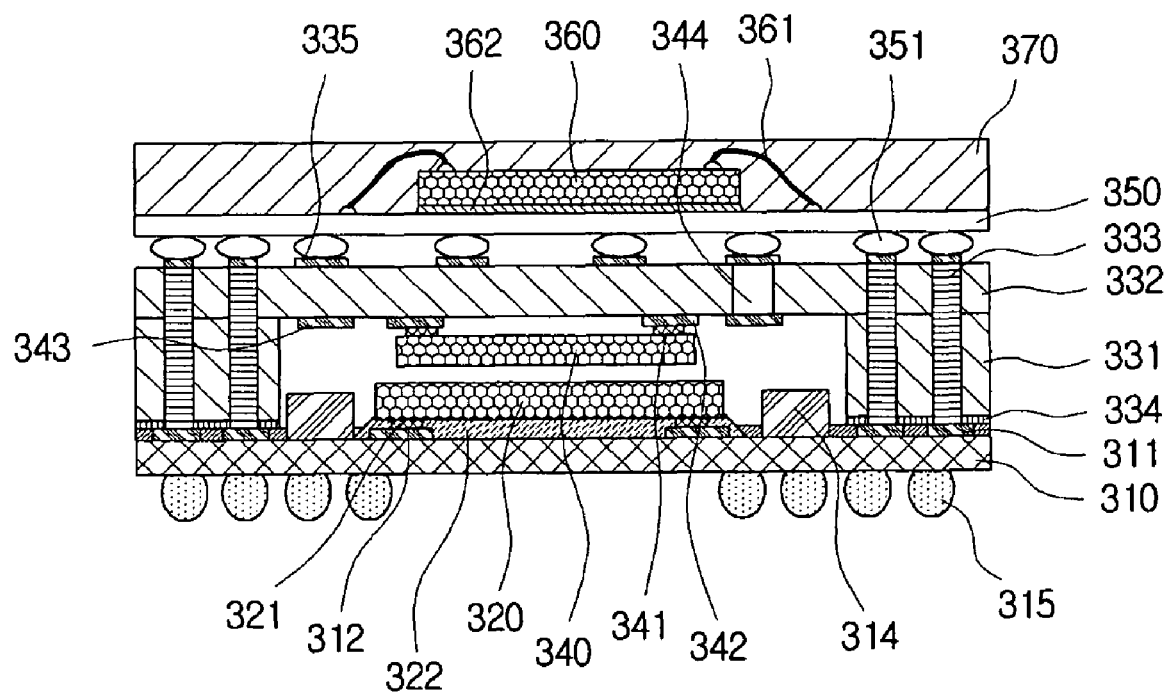
FIG. 5 is a cross-sectional view of a semiconductor package according to another aspect of the invention.

FIG. 5 is a cross-sectional view of a semiconductor package according to another aspect of the invention. In FIG. 5, there are illustrated substrates 310, 350, patterns 311, 335, 343, pads 312, 342, passive components 314, conductive balls 315, 351, chips 320, 340, 360, solder 321, 341, an underfill 322, supports 331, an interposer 332, vias 333, 344, adhesive layers 362, 334, wires 361, and a molding 370.

Similar to the embodiment described previously, the semiconductor package according to this embodiment may also be structured to have an upper layer package stacked over a lower layer package with an interposer 332 positioned inbetween. The structure of the lower layer package will first be described as follows.

The substrate 310 may form the base of the lower layer package, where a pre-designed pattern 311 and pads 312, as well as passive components 314, may be mounted on the substrate 310. Also, multiple conductive balls 315 can be coupled to the bottom of the substrate 310 to form a BGA (ball grid array).

A chip 320 may be mounted on the substrate 310. The chip 320 may be directly connected by way of solder 321 to the pads 312 formed on the substrate 310, and may be firmly supported by an underfill 322. That is, the chip 320 may be mounted by a flip chip method. As such, not only can a sufficient amount of space be obtained on the substrate 310 for forming the pattern 311, etc., that allows connection with the upper layer package, but also numerous passive components 314, such as RLC, can be mounted, making it possible to systemize the lower layer package by itself.

The substrate 310 may be covered by supports 331, formed to a predetermined thickness on the edge of the substrate 310, and an interposer 332 shaped to be placed on the supports 331. That is, the upper side of the substrate 310 may be covered by the interposer 332, whereby a cavity may be formed between the interposer 332 and the substrate 310 that corresponds to the thickness of the supports 331.

In this particular embodiment, a metal oxide layer is suggested for the interposer 332. Using a metal oxide layer may provide a benefit of efficiently dispersing heat that may be generated in the semiconductor package according to this embodiment Also, problems of reliability in stacking, which may be caused by warpage in the lower layer package, may be alleviated. This particular embodiment suggests the use of aluminum oxide ($Al_2O_3$) for the metal oxide layer, in consideration of cost effectiveness and heat-releasing efficiency, etc.

While the interposer 332 and the supports 331 can be fabricated separately and afterwards coupled together, the interposer 332 and the supports 331 can be structured as an integrated body, by etching a thick board member to form the cavity. In this case, the supports 331 may also be made of aluminum oxide ($Al_2O_3$).

A chip 340 may be mounted on the bottom of the interposer 332. As described above, to efficiently utilize the space formed by the substrate 310 and the interposer 332, a chip 320, 340 may be mounted on the upper side of the substrate 310 and the lower side of the interposer 332 each, whereby the degree of integration may be maximized.

While FIG. 5 illustrates the chip 340 mounted on the bottom of the interposer 332 by a flip chip method, it is apparent that wire bonding methods may be used just as well, and that any of a variety of methods for mounting the chip may be used according to design requirements.

The chip 340 mounted on the bottom of the interposer 332 can be electrically connected with the upper layer package also, using the pattern 343 that is formed on the interposer 332 and the vias 344 that penetrate the interposer 332.

The supports 331 may be secured to the substrate 310 using an adhesive layer 334, etc. In the supports 331, vias 333 may be formed that electrically connect the lower layer package with the upper layer package. That is, as illustrated in FIG. 5, vias 333 may be formed that penetrate the supports 331 and the interposer 332 at the upper side of the supports 331. Because of these vias 333, the pattern 311 formed on the substrate 310 of the lower layer package, the patterns 343, 335 formed on the interposer 332, and the pattern (not shown) formed on the substrate 350 of the upper layer package may all be electrically connected with one another.

Since the cavity may be formed by the supports 331 and the chips 320, 340 may be formed in the cavity thus formed, the heights of the supports 331 may be determined in consideration of the thicknesses of the chips 320, 340, etc.

The upper layer package may be stacked on an upper side of the interposer 332. For electrical connection between the upper layer package and the interposer 332, conductive balls 351 may be formed on the bottom of the upper layer package. The structure of the upper layer package will be described in greater detail as follows.

The substrate 350 may form the base of the upper layer package, where a pre-designed pattern (not shown) and a chip 360 may be mounted on the substrate 350. Also, one or more conductive balls 351 may be coupled to the bottom of the substrate 350, as described above, to form an electrical connection with the interposer 332.

The chip 360 may be secured to the substrate 350 using an adhesive layer 362, and may be electrically connected by wires 361 to the pattern (not shown) formed on the substrate 350. The substrate 350 having the chip 360 mounted as such can be covered by a molding 370 and thus can be protected from the exterior.

As with the case of the lower layer package, it is apparent that other elements besides the chip 360, including passive components 314 such as RLC, etc., can be mounted on the substrate 350 of the upper layer package.

Figure 6:
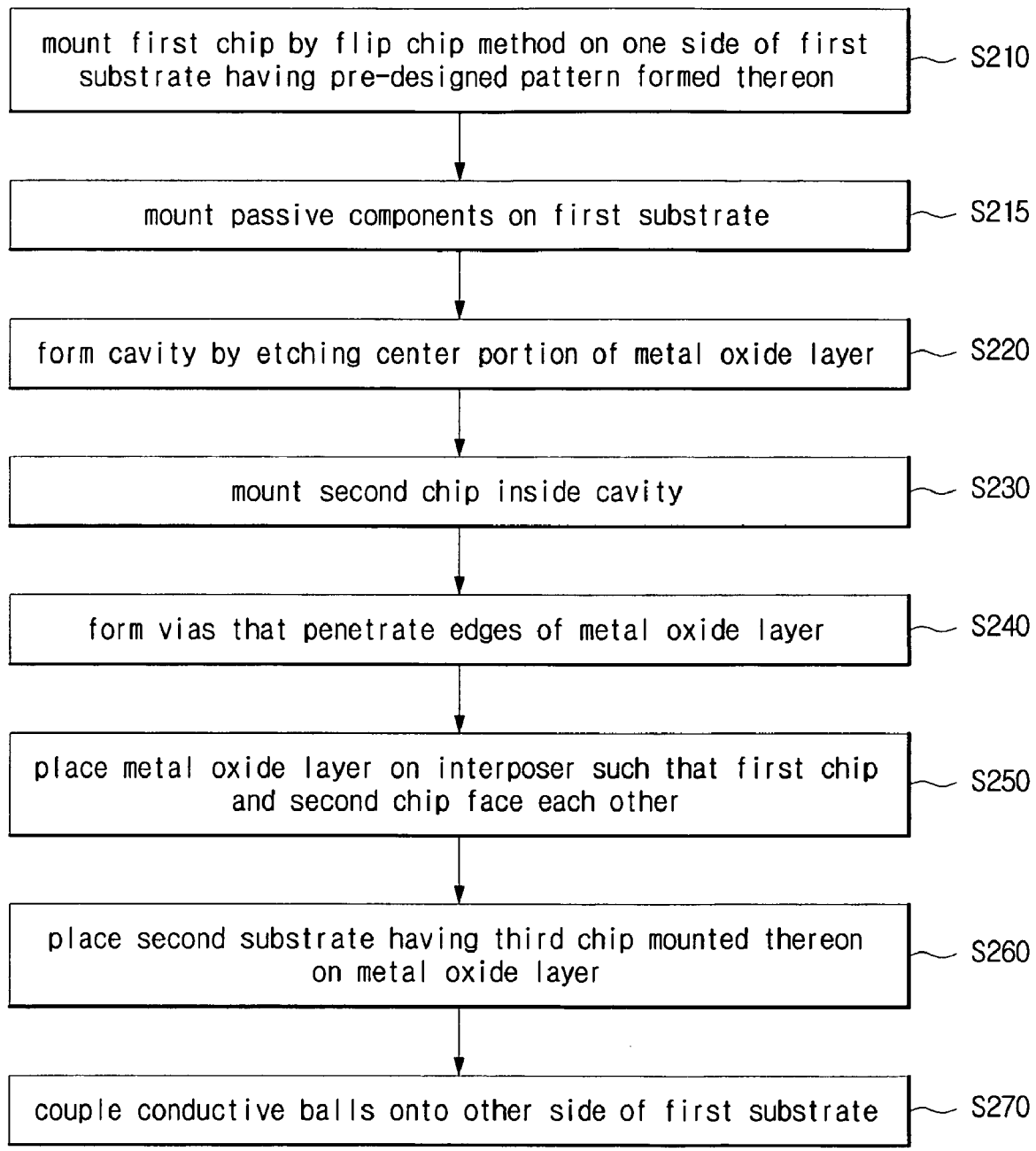
FIG. 6 is a flowchart illustrating a method of manufacturing the semiconductor package of FIG. 5.

A method for the manufacturing of the semiconductor package structured as described above is illustrated in FIG. 6 and FIGS. 7A to 7J. FIG. 6 is a flowchart illustrating a method of manufacturing the semiconductor package of FIG. 5, and FIGS. 7A to 7J are cross-sectional views representing a flow diagram for the method of manufacturing a semiconductor package of FIG. 6. In FIGS. 7A to 7J, there are illustrated substrates 310, 350, patterns 311, 335, 343, pads 312, 342, passive components 314, conductive balls 315, 351, chips 320, 340, 360, solder 321, 341, an underfill 322, supports 331, an interposer 332, vias 333, adhesive layers 362, 334, wires 361, and a molding 370.

In describing this embodiment, the first substrate, first chip, and second chip refer to the substrate and chips of the lower layer package, while the second substrate and third chip refer to the substrate and chip of the upper layer package. This distinction, however, is merely for convenience.

Figure 7A:
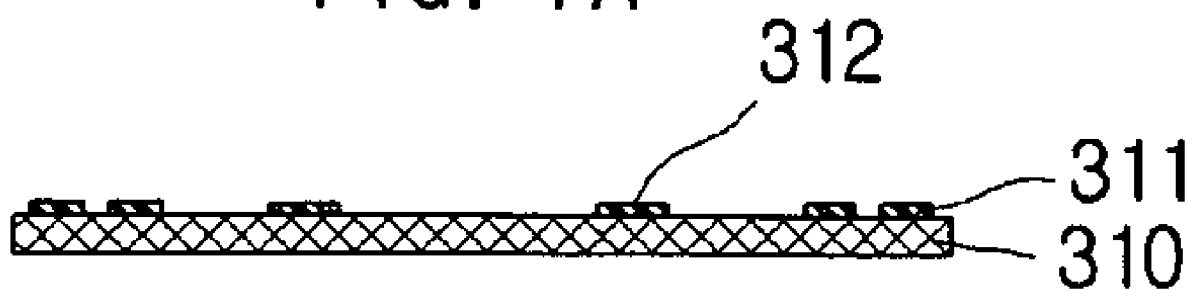
Figure 7B:
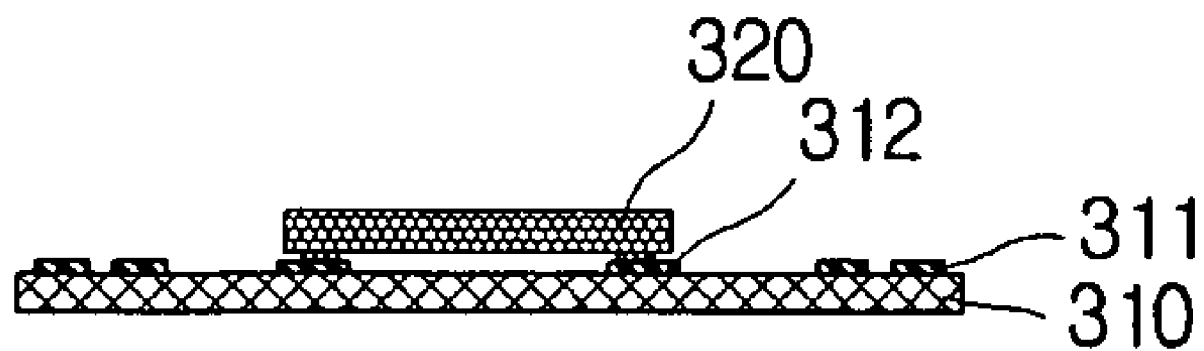

The first chip may be mounted by a flip chip method on one side of the first substrate, on which a pre-designed pattern is formed (S210). As illustrated in FIGS. 7A and 7B, the chip 320 may be directly connected to the pads 312 formed on the substrate 310 by way of solder. In this way, not only can a sufficient amount of space be obtained on the substrate 310 for forming the pattern 311, etc., that allows connection with the upper layer package, but also many passive components 314, such as RLC, can be mounted, making it possible to systemize the lower layer package by itself.

Figure 7C:
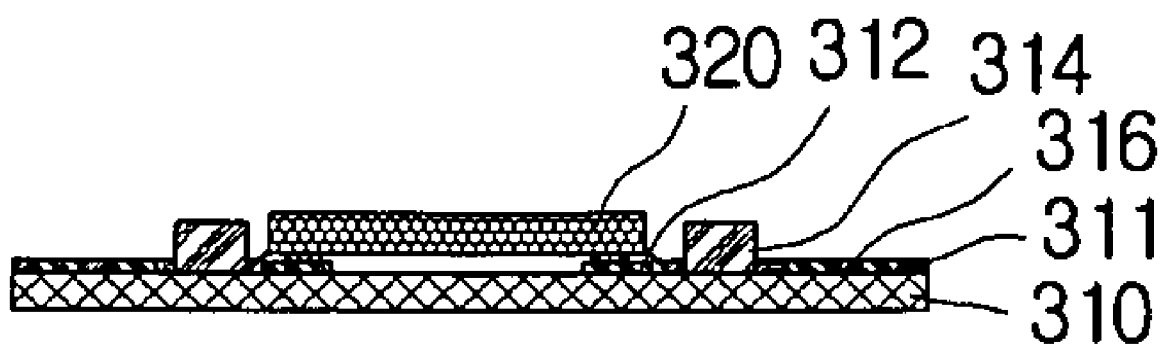

Next, as illustrated in FIG. 7C, the passive components may be mounted on one side of the first substrate (S215). As described above, such passive components 314 make it possible to systemize the lower layer package by itself.

Figure 7D:
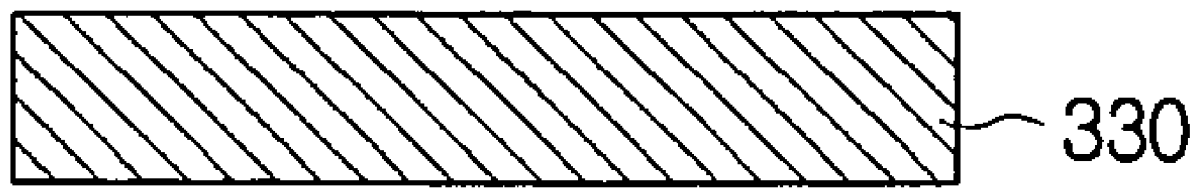
Figure 7E:
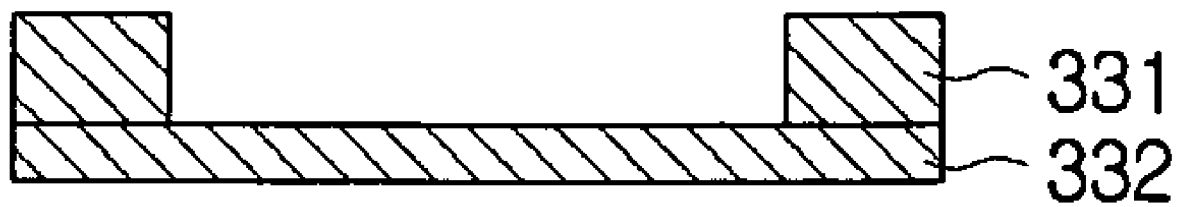

Independently of the substrate 310 for the lower layer package described above, a center portion of a metal oxide layer 330 may be etched to form a cavity (S220), as illustrated in FIGS. 7D and 7E. This may be to form the supports 331 and the interposer 332 which cover the substrate 310 of the lower layer package, and as described above, aluminum oxide can be used as the material.

Also, as described above, the height of the supports 331, i.e. the depth of the cavity, can be determined in consideration of the chips 320, 340 that will be disposed inside the cavity.

Figure 7F:
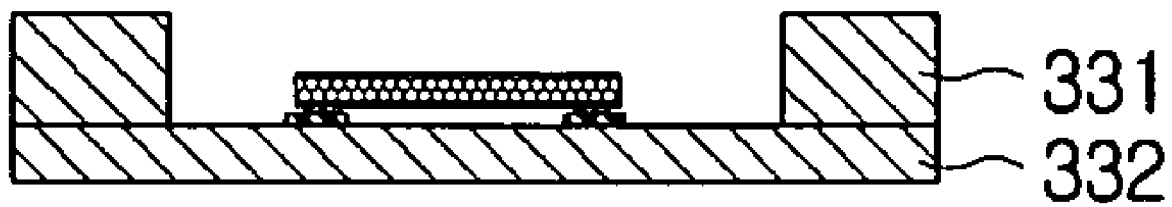

Next, as illustrated in FIG. 7F, the second chip may be mounted inside the cavity (S230). While FIG. 7F illustrates the chip 340 mounted by a flip chip method, it is apparent that wire bonding methods may be used just as well, and that any of a variety of methods for mounting the chip may be used according to design requirements.

Figure 7G:
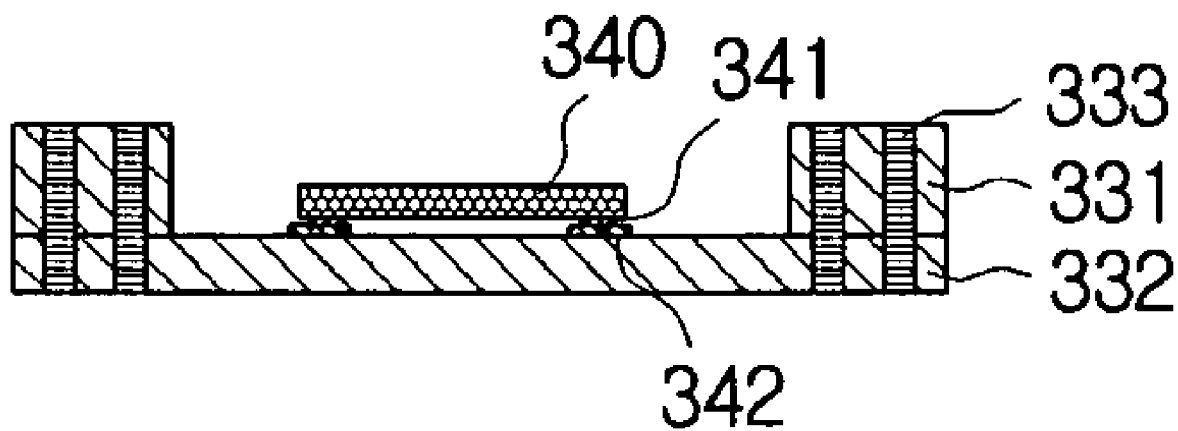

Next, as illustrated in FIG. 7G, vias may be formed which penetrate the edges of the metal oxide layer (S240). The vias 333, each of which penetrates an edge of the metal oxide layer, i.e. penetrates both the support 331 and the interposer 332, can serve to electrically connect the lower layer package with the upper layer package. To form such vias 333, a method may be employed of perforating holes in the edges of the metal oxide layer and filling the holes with a conductive material. Of course, any of various other methods may also be used.

Figure 7H:
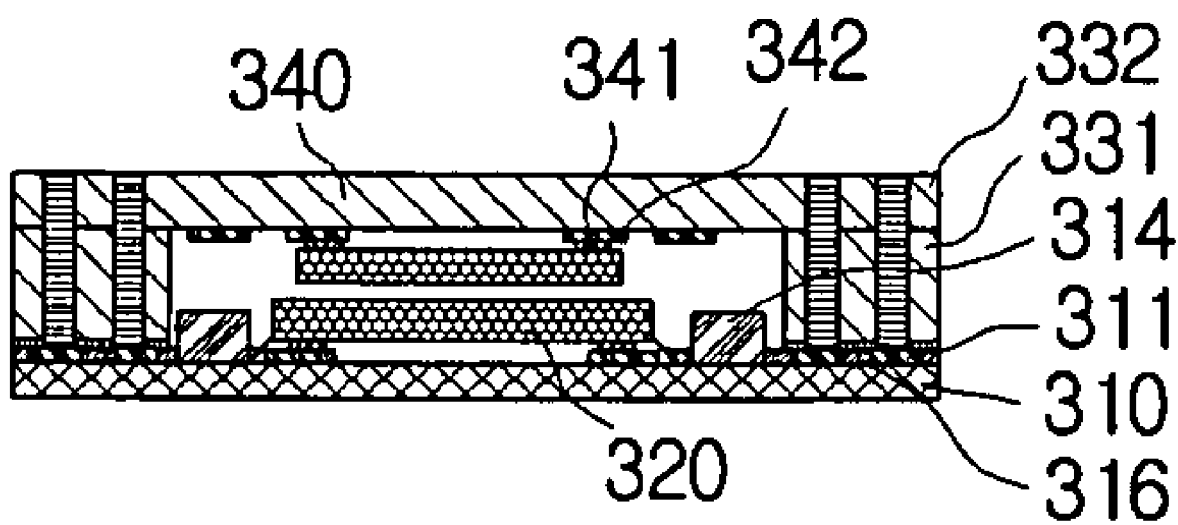
Figure 71:
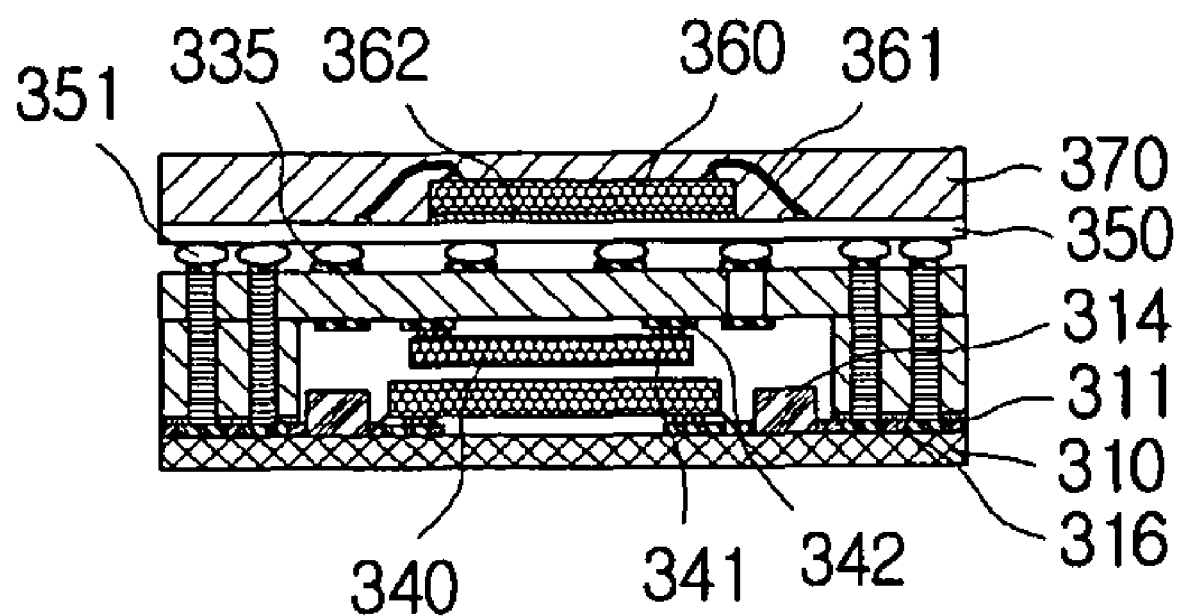

Next, as illustrated in FIG. 7H, the metal oxide layer may be placed on the first substrate such that the second chip and the first chip face each other (S250). Thus, the substrate 310 of the lower layer package may be covered by the metal oxide layer.

Next, as illustrated in FIG. 7I, the second substrate 350, on which a third chip 360 may be mounted, may be placed on the interposer 332 (S260). The second substrate 350 having the third chip 360 mounted on may form the upper layer package.

The second substrate 350 may form the base of the upper layer package, where a pre-designed pattern (not shown) and a chip 360 may be mounted on the substrate 350. Also, one or more conductive balls 351 may be coupled to the bottom of the substrate 350, as described above, to form an electrical connection with the interposer 332.

The chip 360 may be secured to the substrate 350 using an adhesive layer 362, and may be electrically connected by wires 361 to the pattern (not shown) formed on the substrate 350. The substrate 350 having the chip 360 mounted as such can be covered by a molding 370 and thus can be protected from the exterior.

As with the case of the lower layer package, it is apparent that other elements besides the chip 360, including passive components 314 such as RLC, etc., can be mounted on the substrate 350 of the upper layer package.

Figure 7J:
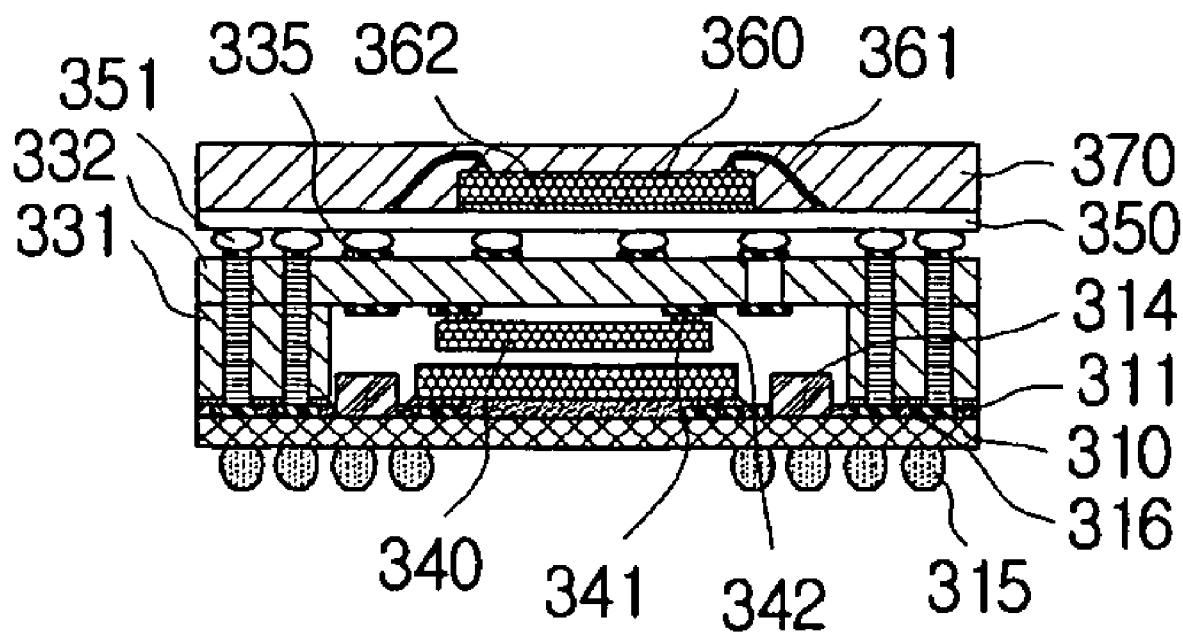

Next, as illustrated in FIG. 7J, conductive balls 315 may be coupled onto the other side of the first substrate (S270). By coupling a plurality of conductive balls 315 onto the bottom of the substrate of the lower layer package, a BGA (ball grid array) may be obtained.

According to certain embodiments of the invention as set forth above, heat-releasing performance can be improved, and a higher degree of integration can be implemented, by mounting chips on the lower layer package by a flip chip method, and by employing an interposer placed between the upper layer package and the lower layer package.

While the spirit of the invention has been described in detail with reference to particular embodiments, the embodiments are for illustrative purposes only and do not limit the invention. It is to be appreciated that those skilled in the art can change or modify the embodiments without departing from the scope and spirit of the invention.

What is claimed is:

1. A semiconductor package comprising:
    a first substrate having a pre-designed pattern formed thereon;
    a first chip mounted by a flip chip method on one side of the first substrate;
    a support formed to a predetermined thickness on an edge of the first substrate;
    an interposer having an edge thereof placed on the support, such that the interposer covers the first substrate and forms a cavity between the interposer and the first substrate, and having a pre-designed pattern formed respectively on both sides thereof;
    a via penetrating the support and the interposer;
    a second chip mounted on one side of the interposer facing the first substrate;
    a second substrate placed on the other side of the interposer with at least one conductive ball positioned in-between; and
    a third chip mounted on the second substrate.

2. The semiconductor package of claim 1, wherein the interposer is a metal oxide layer.

3. The semiconductor package of claim 2, wherein the interposer is made of aluminum oxide ($Al_2O_3$).

4. The semiconductor package of claim 1, further comprising:
    a passive component mounted on the first substrate.

5. The semiconductor package of claim 1, further comprising:
    a plurality of conductive balls formed on the other side of the first substrate.

* * * * *